(12) United States Patent
Bunt et al.

(10) Patent No.: US 8,156,990 B2
(45) Date of Patent: Apr. 17, 2012

(54) APPARATUS FOR PROVIDING UNIAXIAL LOAD DISTRIBUTION FOR LAMINATE LAYERS OF MULTILAYER CERAMIC CHIP CARRIERS

(75) Inventors: Jay A. Bunt, Esopus, NY (US); Donald W. Diangelo, Fishkill, NY (US); Cristian Docu, Montgomery, NY (US); Thomas Foley, Beacon, NY (US); Melvin R. Gottschalk, Jr., Danbury, CT (US); Lisa A. Hamilton, Chelsea, NY (US); Thomas A. Kline, Wappingers Falls, NY (US); Mark J. LaPlante, Montgomery, NY (US); Hsichang Liu, Fishkill, NY (US); Sebastian Loscerbo, Newburgh, NY (US); Govindarajan Natarajan, Poughkeepsie, NY (US); Olga A. Otieno, Bel Air, MD (US); Renee L. Weisman, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 341 days.

(21) Appl. No.: 12/105,494

(22) Filed: Apr. 18, 2008

(65) Prior Publication Data

US 2008/0190565 A1   Aug. 14, 2008

Related U.S. Application Data

(62) Division of application No. 11/164,437, filed on Nov. 22, 2005, now abandoned.

(51) Int. Cl.
*B32B 37/00* (2006.01)

(52) U.S. Cl. .......................................... 156/581; 156/580
(58) Field of Classification Search ............... 156/89.11, 156/89.12, 89.16, 228, 580, 581, 583.1, 583.3
See application file for complete search history.

(56) References Cited

U.S. PATENT DOCUMENTS

| 2,821,747 A | | 7/1955 | Rossiter |
| 4,188,256 A | * | 2/1980 | Schwab ........................ 156/386 |
| 4,345,965 A | | 8/1982 | Lindenmayer et al. |

(Continued)

FOREIGN PATENT DOCUMENTS

JP   06-045765   2/1994

(Continued)

OTHER PUBLICATIONS esp@cenet, [online]; [retrieved Apr. 16, 2008]; retrieved from the Internet http://v3.espacenet.com/textdoc?DB=EPODOC@IDX=JP7030251&F=0 Minoru et al. "Multilayered Ceramic Wiring Board and Manufacture Therof" Patent Abstract: JP7030251 Jan. 31, 1995, 1p.

(Continued)

*Primary Examiner* — James Sells
(74) *Attorney, Agent, or Firm* — Cantor Colburn LLP; Joseph Petrokaitis

(57) ABSTRACT

An apparatus for providing uniform axial load distribution for laminate layers of multilayer ceramic chip carriers includes a base plate configured to support a plurality of green sheet layers thereon, the base plate having at least one resiliently mounted load support bar disposed adjacent outer edges of the base plate. The load support bar is mounted on one or more biasing members such that the top surface of the support bar extends above the top surface of the base plate by a selected distance.

5 Claims, 14 Drawing Sheets

U.S. PATENT DOCUMENTS

| | | | |
|---|---|---|---|
| 4,583,352 A * | 4/1986 | Heron | 53/570 |
| 5,069,120 A | 12/1991 | Schneider | |
| 5,468,315 A * | 11/1995 | Okada et al. | 156/64 |
| 6,221,193 B1 | 4/2001 | Cassidy et al. | |
| 6,406,778 B1 | 6/2002 | Natarajan et al. | |
| 6,597,058 B1 | 7/2003 | Natarajan et al. | |
| 6,607,620 B2 | 8/2003 | Knickerbocker et al. | |
| 6,607,780 B1 | 8/2003 | Natarajan et al. | |
| 6,626,225 B1 | 9/2003 | Kochberger | |
| 6,627,020 B2 | 9/2003 | Natarajan et al. | |
| 6,726,984 B2 | 4/2004 | Natarajan et al. | |
| 6,790,515 B2 | 9/2004 | Knickerbocker et al. | |
| 2002/0092600 A1 | 7/2002 | Natarajan et al. | |
| 2004/0003494 A1 | 1/2004 | Asami et al. | |
| 2005/0046410 A1 | 3/2005 | Fleischman et al. | |
| 2005/0214508 A1 | 9/2005 | Natarajan | |
| 2007/0065647 A1 | 3/2007 | Natarajan et al. | |

FOREIGN PATENT DOCUMENTS

| | | |
|---|---|---|
| JP | 730251 A | 1/1995 |
| JP | 8222474 A | 8/1996 |
| JP | 8264947 A | 10/1996 |
| JP | 9260844 A | 10/1997 |
| JP | 10199749 A | 7/1998 |
| JP | 2003158376 A | 5/2003 |
| JP | 20040186290 A | 7/2004 |
| JP | 2005-019752 | 1/2005 |
| JP | 2005056880 A | 3/2005 |
| JP | 2005294487 A | 10/2005 |
| WO | 2005065936 A1 | 7/2005 |

OTHER PUBLICATIONS esp@cenet, [online]; [retrieved Apr. 16, 2008]; retrieved from the Internet http://v3.espacenet.com/textdoc?DB=EPODOC@IDX=JP8222474&F=0 Takao et al., "Manufacture of Ceramic Electronic Component" Patent Abstract: JP8222474 Aug. 30, 1996, 1p.

esp@cenet, [online]; [retrieved Apr. 16, 2008]; retrieved from the Internet http://v3.espacenet.com/textdoc?DB=EPODOC@IDX=JP8264947&F=0 Makoto et al., "Manufacture of Multilayer Ceramic Board" Patent Abstract: JP8264947 Oct. 11, 1996, 1p.

esp@cenet, [online]; [retrieved Apr. 16, 2008]; retrieved from the Internet http://v3.espacenet.com/textdoc?DB=EPODOC@IDX=JP9260844&F=0 Hideaki et al., "Ceramic Multilayered Board Manufacturing Method" Patent Abstract: JP9260844 Oct. 3, 1997, 1p.

esp@cenet, [online]; [retrieved Apr. 16, 2008]; retrieved from the Internet http://v3.espacenet.com/textdoc?DB=EPODOC@IDX=JP10199749&F=0 Yoichi et al., "Method for Manufacturing Multilayer Ceramic Electronic Part" Patent Abstract: JP10199749, Oct. 3, 1997, 1p.

esp@cenet, [online]; [retrieved Apr. 16, 2008]; retrieved from the Internet http://v3.espacenet.com/textdoc?DB=EPODOC@IDX=JP2003158376&F=0 No Author Listed, "No Title Listed" Patent Abstract: JP2003158376, May 30, 2003, 1p.

esp@cenet, [online]; [retrieved Apr. 16, 2008]; retrieved from the Internet http://v3.espacenet.com/textdoc?DB=EPODOC@IDX=JP2004186290&F=0 Hiroyoshi et al., "Method for Manufacturing Laminated Ceramic Electronic Component" Patent Abstract: JP2004186290, Jul. 2, 2004, 1p.

esp@cenet, [online]; [retrieved Apr. 16, 2008]; retrieved from the Internet http://v3.espacenet.com/textdoc?DB=EPODOC@IDX=JP2005056880&F=0 Takahiro et al., "Method for Manufacturing Laminated Ceramic Electronic Part" Patent Abstract: JP2005056880, Mar. 3, 2005, 1p.

esp@cenet, [online]; [retrieved Apr. 16, 2008]; retrieved from the Internet http://v3.espacenet.com/textdoc?DB=EPODOC@IDX=JP2005294487&F=0 Kuniyasu et al., "Method for Manufacturing Laminated Electronic Component" Patent Abstract: JP2005294487, Oct. 20, 2005, 1p.

* cited by examiner

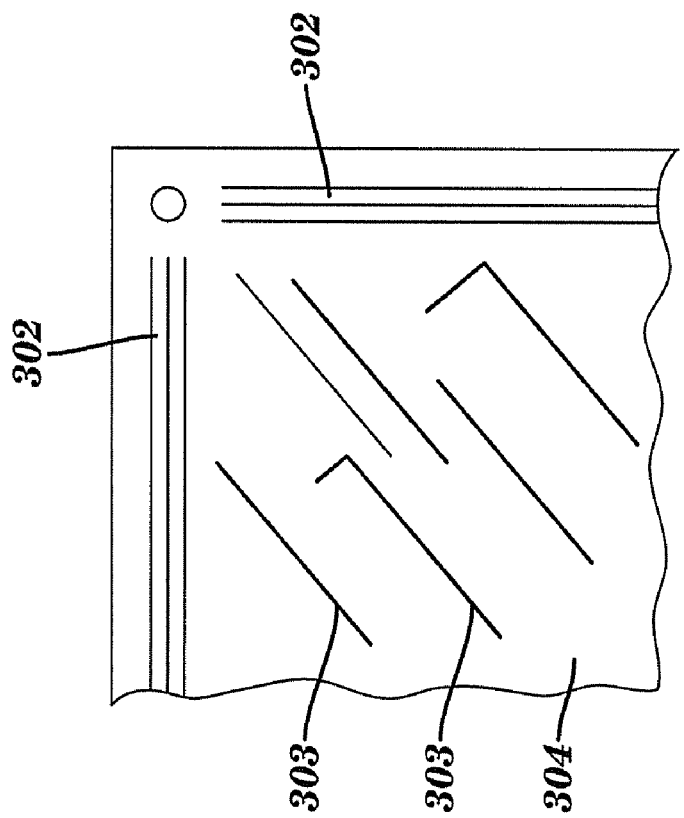
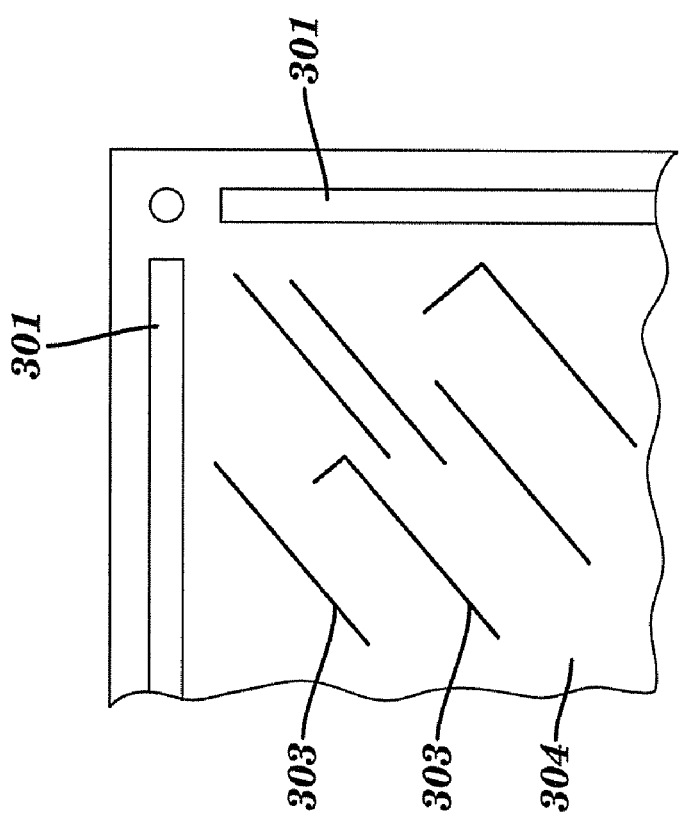

APPARATUS FOR PROVIDING UNIAXIAL LOAD DISTRIBUTION FOR LAMINATE LAYERS OF MULTILAYER CERAMIC CHIP CARRIERS

CROSS-REFERENCE TO RELATED APPLICATIONS

This application is a division of U.S. patent application Ser. No. 11/164,437, filed Nov. 22, 2005, now abandoned, the disclosure of which is incorporated by reference herein in its entirety.

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND

The present invention relates generally to manufacturing of multi-layer ceramic chip carriers and, more particularly, to a method and apparatus for providing uniform axial (uniaxial) load distribution for laminate layers of multilayer ceramic chip carriers.

In the ceramic electronics packaging industry, multi-layer ceramic (MLC) technology is typically used to create three-dimensional circuitry in ceramic chip carriers for microelectronic devices such as integrated circuits and ceramic capacitors. The three-dimensional circuitry in a ceramic chip carrier is made by applying a conductive paste pattern on a ceramic and polymer composite sheet. The ceramic and polymer composite sheet is also known as a "green sheet," and may also include a number of via holes formed therein in order to allow vertical connection between the conductive paste patterns on adjacent sheets. After the vias are punched, the green sheets are screened and patterned by applying a conductive paste into the via holes and along the surface of the green sheet. The green sheets are then generally stacked in a designated order and laminated together under appropriate temperature and pressure to form a solid laminate. After the stacking and lamination processes, the green laminate is diced into appropriate or functional dimensions for the sintering to form ceramic chip carriers.

FIG. 1 illustrates an existing apparatus and process for stacking and laminating a plurality of individual green sheets 101 to manufacture an MLC green laminate. Because of the differences in loading of the conductive paste 102 (i.e., the differences in the pattern density of paste material) on each green sheet 103, such that the conductive paste loading is lighter at the peripheral areas 104 and heavier in the central areas 105, which results in the pillow-shaped morphology 106 after the stacking of a large number of green sheets.

A typical advanced, high-performance MLC green laminate can include more than 30 layers (even as high as 100 layers) of green sheets having X-Y dimensions of greater than 150 mm×150 mm. Moreover, a typical ceramic green sheet is about 50-500 microns (µm) in thickness, with screen-on conductive paste patterns of about 10-50 µm in height formed upon the green sheet surface. The above described pillow-shaped MLC stack shown in FIG. 1 will then be subsequently compressed under a high compressive force (arrows 107) using the top and bottom steel base plates 108 of the lamination tool such that the entire stack of multi-layered green sheets bonds together to form a solid green laminate.

Unfortunately, due to the pillow-shaped morphology of the green sheet stack, the conductive paste patterns 201 formed along the peripheral areas of the green sheets in the upper portion of the laminate are subject to smearing related damage, as shown in FIGS. 2(a) and 2(b). In particular, the edge smearing damage of the conductive paste patterns results from the unequal shear force between at least two adjacent green sheets present at the pillow-shaped edge area, as opposed to the (solely) vertical compressive stress components present at the center flat area, that are applied to the conductive paste patterns during the highly compressive lamination process. Once the conductive paste patterns are damaged by smear within the green sheet stack (and hence within a green sheet laminate), the sintered MLC chip carriers are considered to be an electrical defect.

Accordingly, it would be desirable to be able to form complex, multi-layer ceramic chip carriers, in a manner that avoids the above described difficulties relating to pillow-effect smearing and damage.

SUMMARY

The above discussed drawbacks and deficiencies of the prior art are overcome or alleviated by an apparatus for providing uniform axial load distribution for laminate layers of multilayer ceramic chip carriers. In an exemplary embodiment, the apparatus includes a base plate configured to support a plurality of green sheet layers thereon, the base plate having at least one resiliently mounted load support bars disposed adjacent outer edges of the base plate. The at least one load support bar is mounted on one or more biasing members such that the top surface of the support bar extends above the top surface of the base plate by a selected distance.

In another embodiment, an apparatus for providing uniform axial load distribution for laminate layers of multilayer ceramic chip carriers includes a segmented frame assembly for receiving a green sheet stack therein, the segmented frame assembly configured for lateral insertion of one or more coupons to be placed between at least a pair of individual green sheets. The segmented frame assembly and one or more coupons are configured to flatten said pair of individual green sheets with respect to one another and prevent lateral movement therebetween.

In still another embodiment, a method for providing uniform axial load distribution for laminate layers of multilayer ceramic chip carriers includes forming sacrificial paste patterns on at least one non-functional, peripheral region of at least one green sheet in a multi-layer green sheet stack, compressing the multi-layer green sheet stack to form a laminate, sintering the laminate and removing peripheral edges of the laminate including the sacrificial paste patterns therein.

In still another embodiment, a method for providing uniform axial load distribution for laminate layers of multilayer ceramic chip carriers includes mounting at least one thickness compensation frame within a lamination tool, the at least one thickness compensation frame having at least one width corresponding to at least one width of non-functional, peripheral regions of an individual green sheet in a multi-layer green sheet stack. A total height of the at least one thickness compensation frame is substantially equivalent to a distance representing a gap created by a pillow effect stack of the multi-layer green sheet.

BRIEF DESCRIPTION OF THE DRAWINGS

Referring to the exemplary drawings wherein like elements are numbered alike in the several Figures:

FIGS. 3(a) and 3(b) illustrate a corner area of a green sheet having sacrificial paste strip material applied along the peripheral, non-functional areas thereof, in accordance with an embodiment of the invention;

DETAILED DESCRIPTION

Disclosed herein is a method and structure for eliminating the above described pillow-shaped stack of the multi-layer green sheets, thereby preventing smearing damage of the conductive paste pattern along the peripheral areas of green sheets. As a result, greater electrical circuitry design flexibility for advanced MCM products is provided.

In one exemplary embodiment, a method of stacking multi-layer green sheets features the screening of one additional compensating strip (or, alternatively, a plurality of sacrificial compensating paste lines) along the peripheral, non-functional areas of the green sheets. These sacrificial compensating patterns are screened on, for example, each green sheet in a multi-layer green sheet stack, and have the same paste height as the functional conductive patterns. Thus configured, the additional, non-functional compensating patterns eliminate the "pillow-effect" in the stacking and the subsequent high-pressure lamination processes, enabling each of the functional conductive patterns to achieve uniform and parallel compression without edge smearing damages. After the high-pressure lamination process, the non-functional areas of the laminate including the additional, sacrificial compensating patterns along the peripheral areas are diced off and the functional laminate is sent to a sintering process.

The paste materials used for the sacrificial compensating paste patterns may be the same as those used for the functional conductive paste patterns, including, for example, powders of: copper, molybdenum, tungsten, nickel, palladium, platinum, silver and gold, mixed with other polymeric materials to form the pastes.

FIGS. 3(a) and 3(b) illustrate a corner area of an exemplary green sheet suitable for use in accordance with one embodiment of the invention. In FIG. 3(a), a single additional paste strip 301 is applied (screened) along the peripheral, non-functional areas around the edges of the green sheet 304, which also includes functional conductive lines 303. Alternatively, FIG. 3(b) features the application of a plurality of thinner, individual strips 302 along the non-functional areas of the green sheet 304.

Figure 4A:
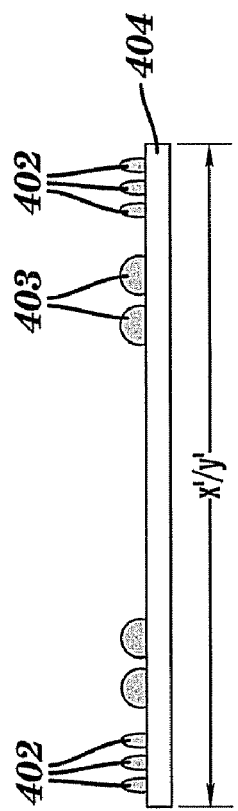
FIGS. 4(a) and 4(b) are cross-sectional views of the embodiments of FIGS. 3(a) and 3(b), respectively.
Figure 4B:
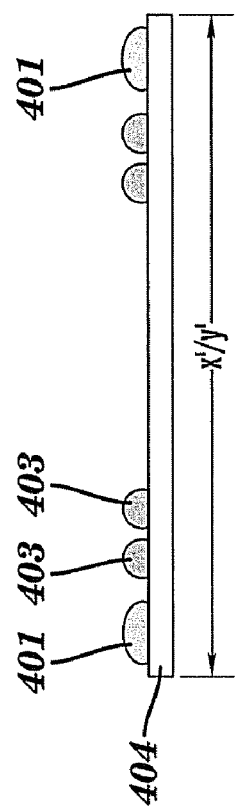

Regardless of whether a single, wider sacrificial strip 301 is applied (FIG. 3(a)) or multiple, thinner strips 302 are applied (FIG. 3(b)) to the non-functional areas of the green sheets 304, the height of the sacrificial strips on each green sheet in a multi-layer green stack have (in an exemplary embodiment) the same paste height as the functional conductive patterns 303. This is particularly illustrated in FIGS. 4(a) and 4(b), which are cross-sectional views of the embodiments of FIGS. 3(a) and 3(b), respectively. For example, the wide sacrificial strips 401 formed on the periphery of green sheet 404 in FIG. 4(a) have the same height as the functional strips 403. Similarly, the thin sacrificial strips 402 formed on the periphery of green sheet 404 in FIG. 4(b) also have the same height as the functional strips 403.

Figure 2B:
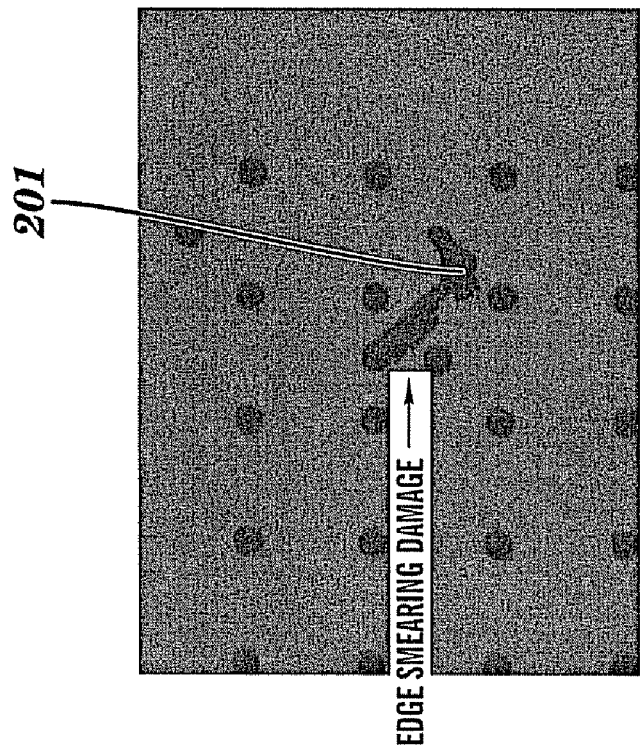
FIGS. 2(a) and 2(b) illustrate pillow-effect" damage that occurs due to compression and lamination of multiple green sheets where conductive paste loading is lighter at the peripheral areas and heavier in the central areas of the green sheets.
Figure 2A:
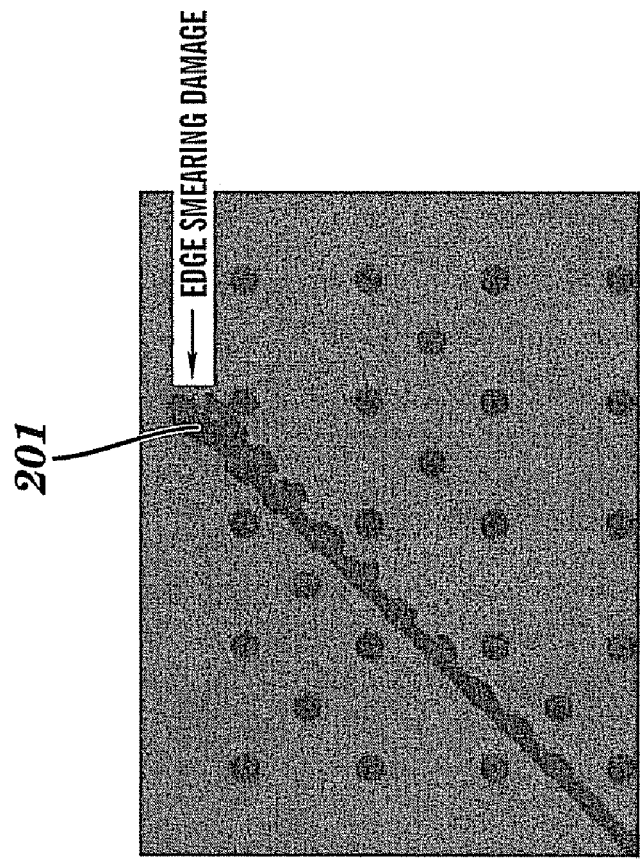
Figure 5A:
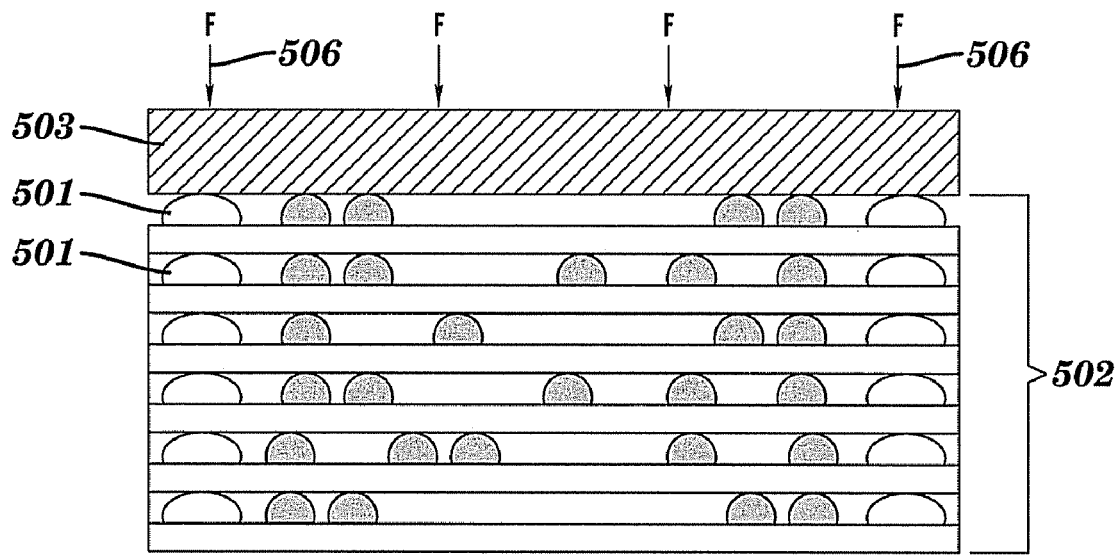
FIGS. 5(a) and 5(b) are cross-sectional views of the stacking and lamination process of green sheets to form a multi-layer green laminate in accordance with the sacrificial paste embodiments of FIGS. 3 and 4.
Figure 5B:
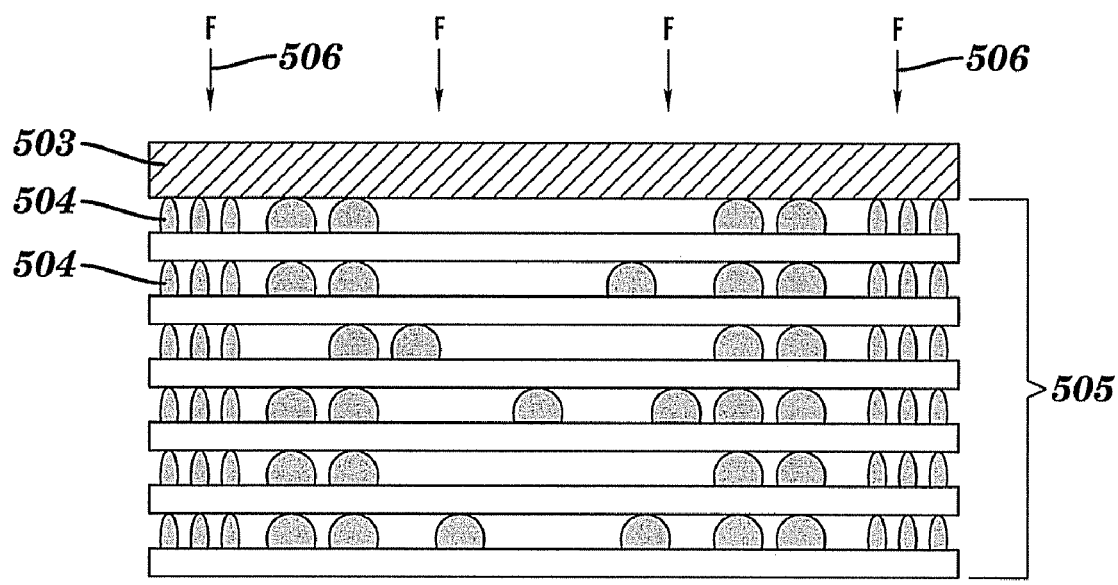
Figure 6A:
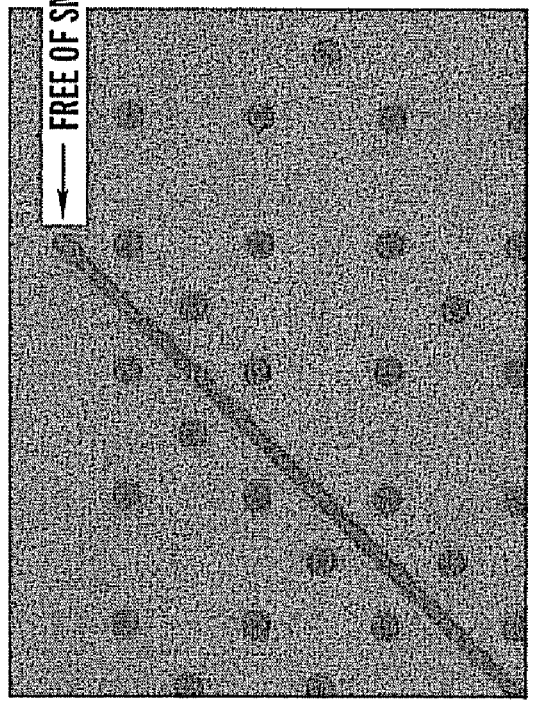
FIGS. 6(a) and 6(b) depict the same conductive paste patterns as shown in FIGS. 2(a) and 2(b), but formed without smearing damage.
Figure 6B:
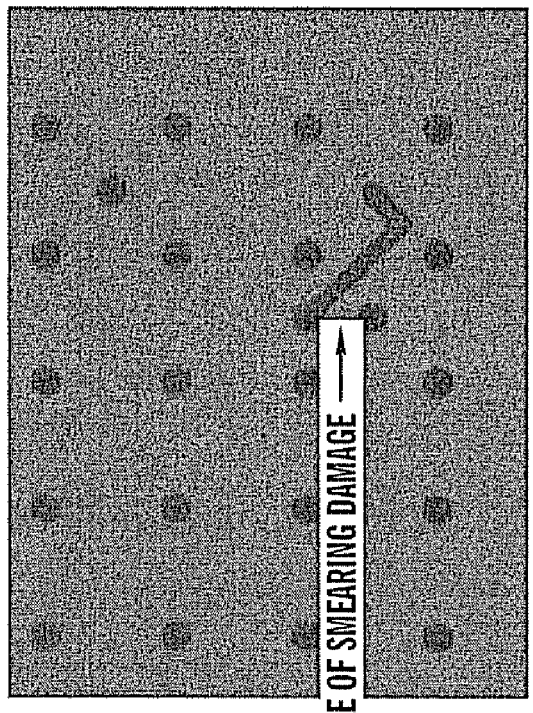

FIGS. 5(a) and 5(b) illustrate cross-sectional views of the stacking and lamination process of green sheets to form a multi-layer green laminate 502, 505 in accordance with the sacrificial paste embodiments of FIGS. 3(a)/4(a) and 3(b)/4(b), respectively. In either case, it will be noted that the sacrificial paste strips 501, 504 eliminate the pillow effect. Thus, when the compression force (arrows 506) is applied to lamination plate 503, the force is uniformly distributed to all of the functional conductive patterns. Moreover, because the compressive stress is vertically transferred to all the functional line patterns in each green sheet layer, without shearing damages, the line patterns will not suffer smearing damage. This is illustrated in FIGS. 6(a) and 6(b), which depict the same conductive paste patterns as shown in FIGS. 2(a) and 2(b), only without the smearing damage. After uniform compression of the green sheet layers, the peripheral areas having the sacrificial paste patterns will be diced-off, followed by a sintering process to complete the formation of ceramic chip carriers.

Figure 1:
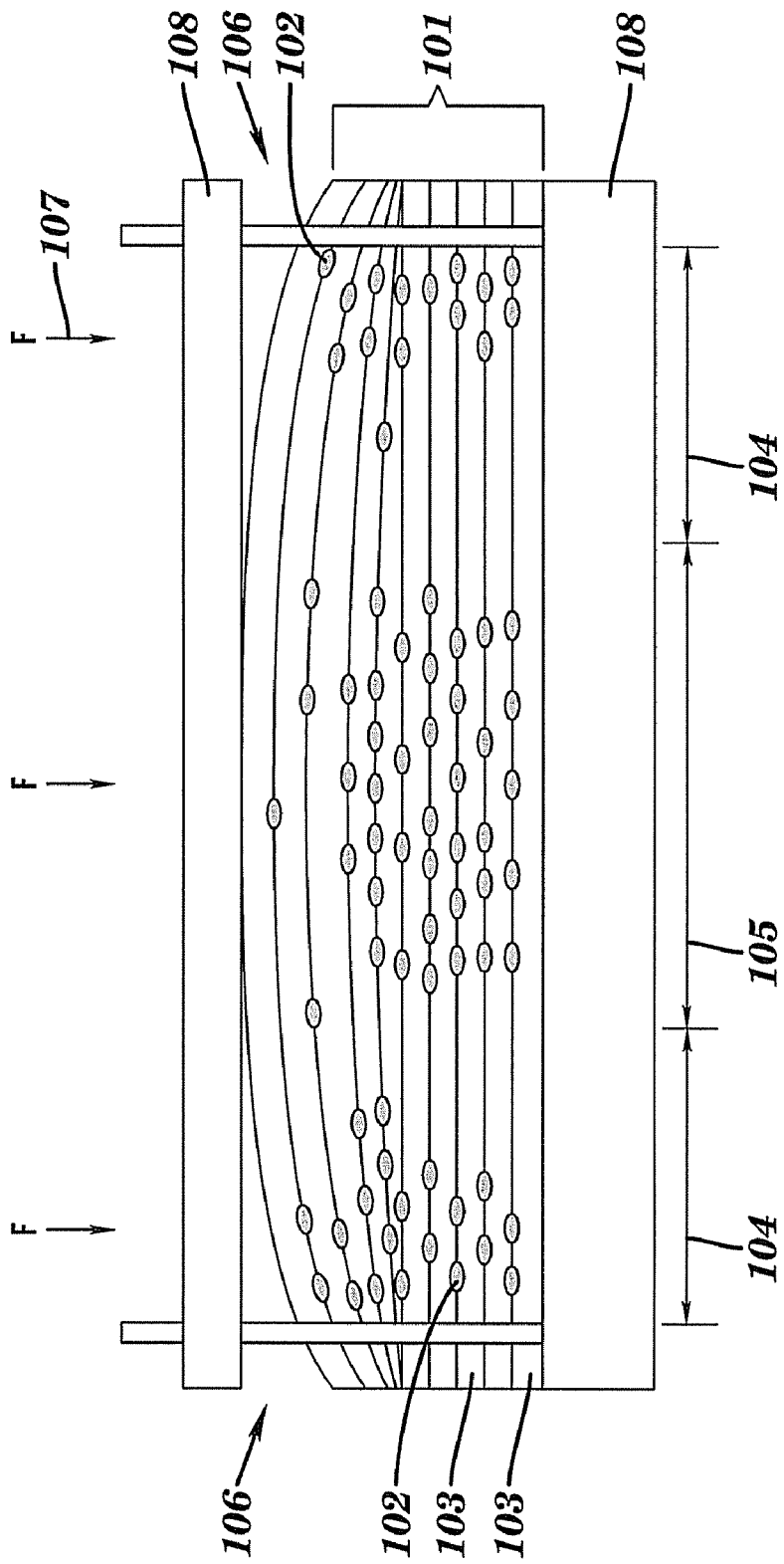
FIG. 1 is a cross-sectional view of an existing apparatus and process for stacking and laminating a plurality of individual green sheets to manufacture a multi-layer ceramic (MLC) green laminate.
Figure 7:
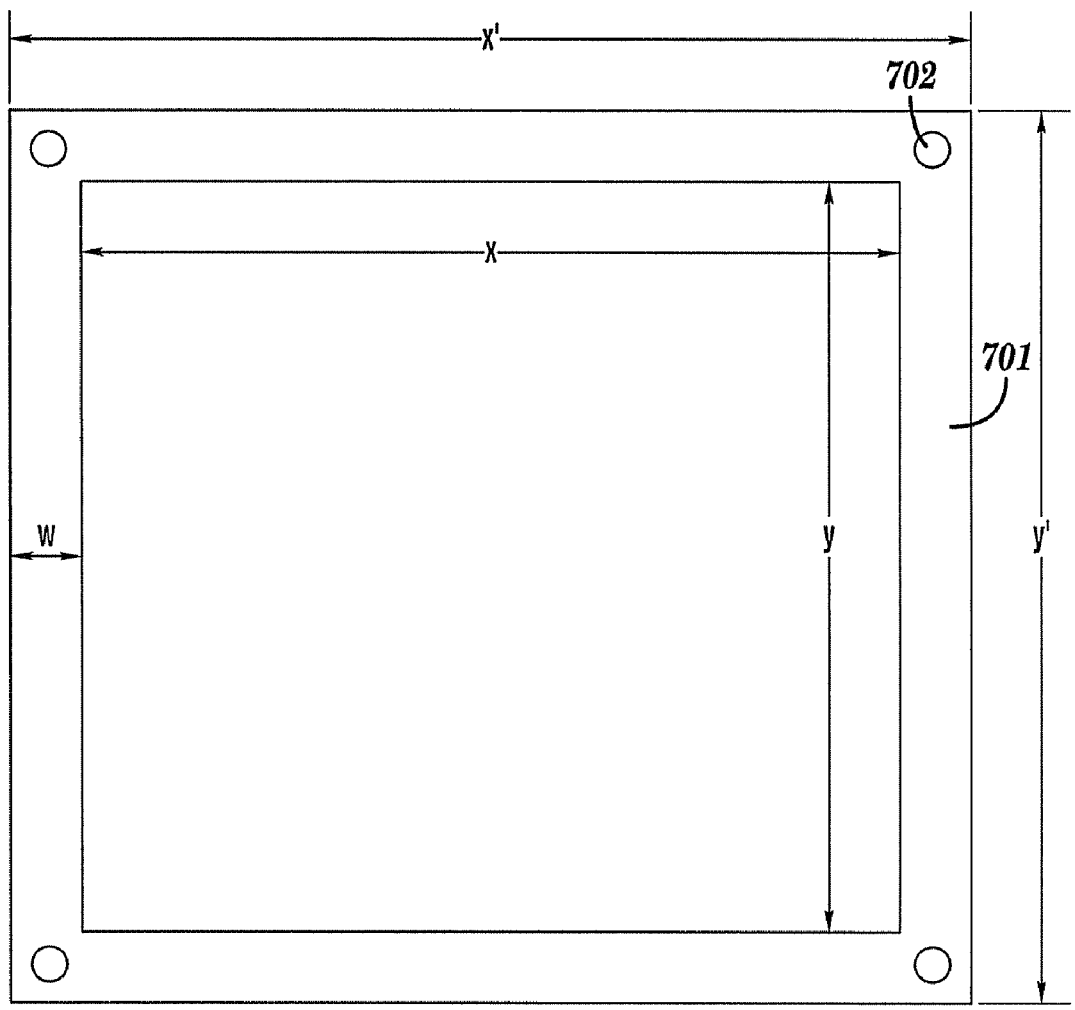
FIG. 7 is a top view of a thickness compensation frame used in accordance with an alternative embodiment of the invention.

In another exemplary embodiment, a method of stacking multi-layer green sheets features the use of a (thickness) compensation frame 701, having a specific width, length and thickness, illustrated in FIG. 7. In addition, the compensation frame 701 is provided with a hole 702 at each corner thereof in order to be mounted onto the posts of a lamination tool such as that shown in FIG. 1. The materials used for the thickness compensation frames may be the same materials as used for the green sheets (e.g., alumina-based or silica-based ceramic), or other polymeric organic materials (e.g., silicone rubber, Mylar, polyester, Teflon, polyimide films), or even metallic materials (e.g., steel, aluminum, copper, etc.).

Depending upon the intended placement of the compensation frame 701 with respect to the green sheet layers, the thickness thereof may be thinner than, thicker than, or equal to the thickness of the green sheets to be stacked. For example, the thickness of an individual compensation frame may range from about 25 µm to about 2000 µm, which is about 1 to 80 times the height of the conductive paste formed on a green sheet. The dimensions of x' and y' in FIG. 7 are about equal to those of a green sheet, while the dimensions x and y correspond the dimensions of the active, functional areas of a laminate. The width, w, of the frame 701 corresponds to the non-functional areas in the green sheet, which again will be diced-off after the completion of the stacking and lamination of a laminate.

Figure 8:
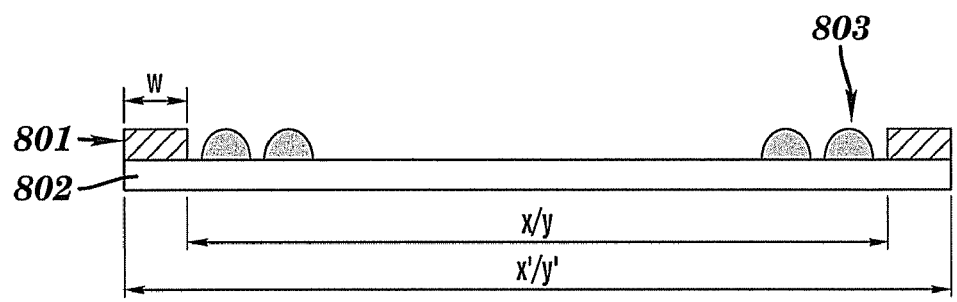
FIG. 8 is a schematic, cross-sectional representation of the compensation frame and green sheet of FIG. 7, mounted on a green sheet.

FIG. 8 is a schematic, cross-sectional representation of the compensation frame 801 and green sheet 802 of FIG. 7. In this sectional view, it is seen that the height of conductive paste patterns 803 on the green sheet 802 is about equal to the thickness (height) of the frame 801. In addition, the thickness of the compensation frame 801 may be thinner than, thicker than or equal to the thickness of the green sheets to be stacked. Regardless, the thickness and number of each frame used in a given green sheet laminate are selected, calculated and designed such that the "pillow effect" in the resulting multi-layer green sheet stack is eliminated.

Figure 9:
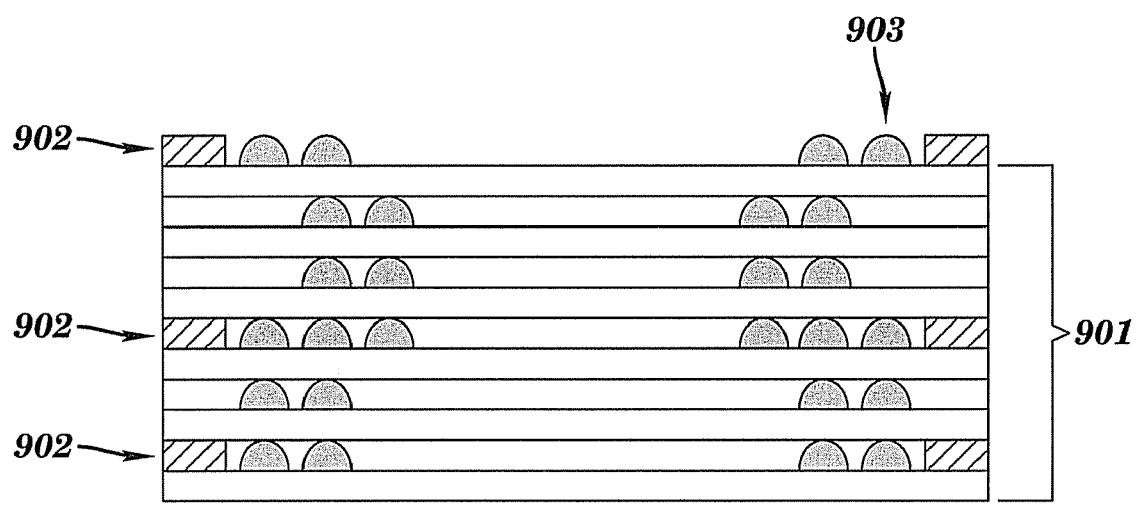
FIGS. 9 and 10 illustrate a plurality of interleaved thickness compensation frames for a green sheet stack.

In one configuration, a single thickness compensation frame may be placed at the base of the lamination tool, supporting each of the green sheets, as shown hereinafter. Alternatively, as shown in FIG. 9, a green sheet stack 901 has a plurality of compensation frames 902 interleaved therein. The sectional views of the conductive paste patterns 903 are also illustrated. In this embodiment, the materials used for the interleaved frames are the same as the green sheet materials, or other polymeric organics or silicone rubber materials. The interleaving sequence between the functional green sheets and compensation frames are positioned and so as to achieve optimal results with respect to eliminating the pillow effect. An exemplary sequence for placing a plurality of interleaved frames may be, for instance, frames at the first, fifth, tenth, fifteenth, twentieth, twenty-fifth, . . . , and N–$5^{th}$, wherein N is the total number of green sheets in a given MLC green sheet laminate. More generally, an interleaving sequence and the specific number of compensation frames used for this application may depend on the materials and thickness of each frame, the total number of functional green sheets, the extent of pillow effect, and the distributions of conductive pastes on each layer of the green sheets.

Figure 10:
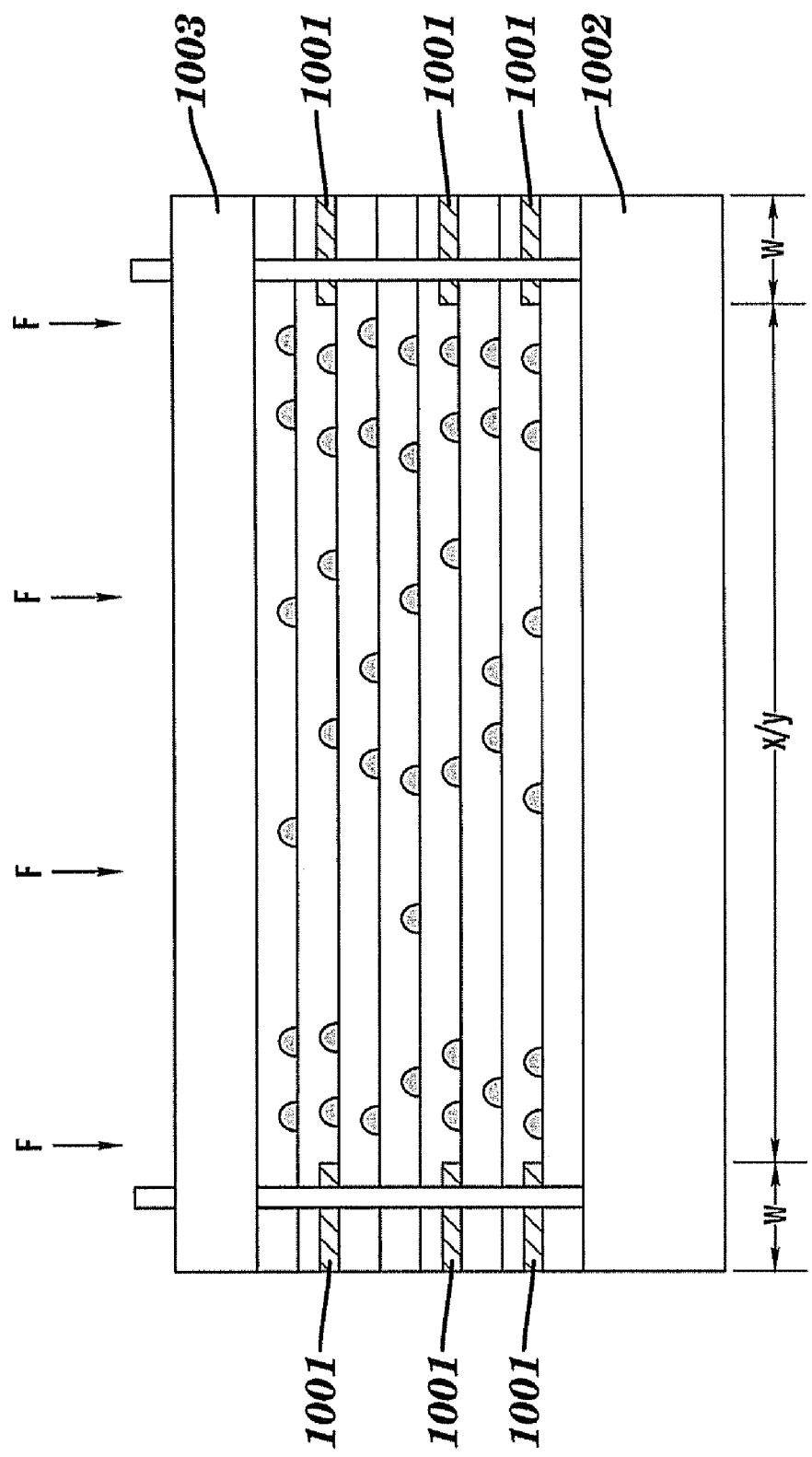

A green sheet stack having interleaved compensation frames such as shown in FIG. 9 is also shown in the lamination tool in FIG. 10. The green sheet stack having a plurality of compensation frame sheets 1001 interleaved therein is relieved of the pillow-effect stack when mounted between the blocks 1002, 1003 of the lamination tool. Again the width of the compensation frames 1001 corresponds to the width of the non-functional regions of the periphery of the green sheets. After the high pressure pressing of the green sheet stack, the peripheral areas having the frames 1001 will be diced-off prior to the sintering process.

Figure 11:
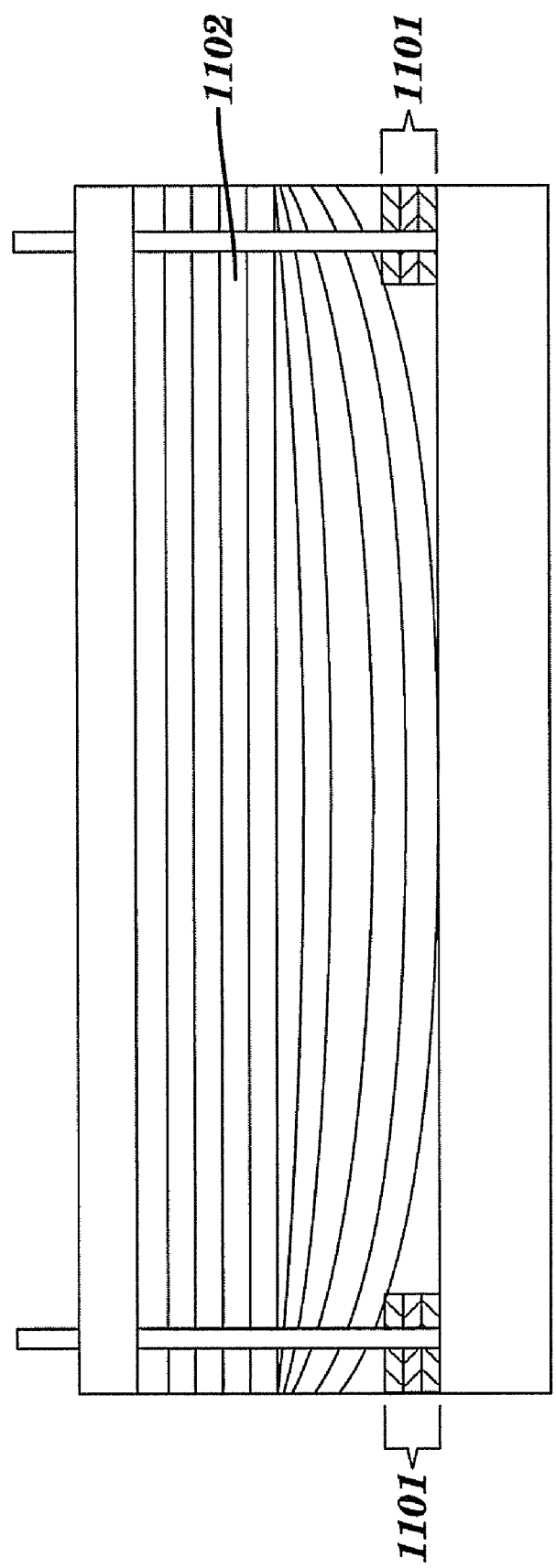
FIG. 11 illustrates a plurality of thickness compensation frames supporting a green sheet stack.

FIG. 11 illustrates an alternative embodiment of a single-thickness frame used at the base of a lamination tool as discussed above. Where the compensation frame is to be used at the base of the tool (instead of interleaved at various locations within the green sheet stack), either a single-thickness frame or multiple compensation frames 1101 are placed below the multi-layer green sheet stack 1102. In this case, the materials of the compensation frames 1101 in this application may either be disposable (such as the same materials as the green sheets or other polymeric organic materials) or re-usable silicone rubbers and metallic frames made of steels, copper or aluminum, for example. The compensation frames 1101 are removable from the laminate after the high-pressure lamination operation, and the non-functional peripheral areas (having a depression formed due to the frames) are simply diced-off prior to sintering.

Figure 12A:
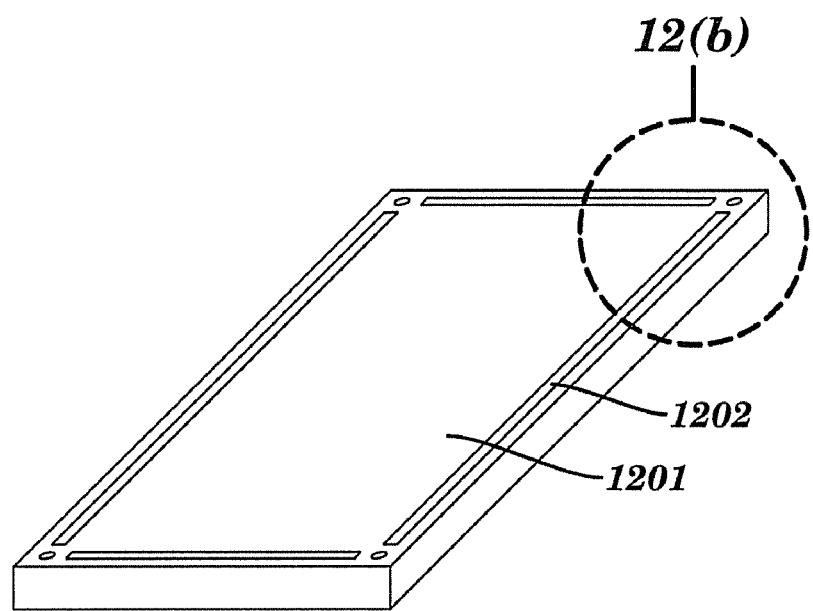
FIG. 12 is a perspective view of a base plate of a lamination tool configured in accordance with alternative embodiment of the invention.
Figure 12B:
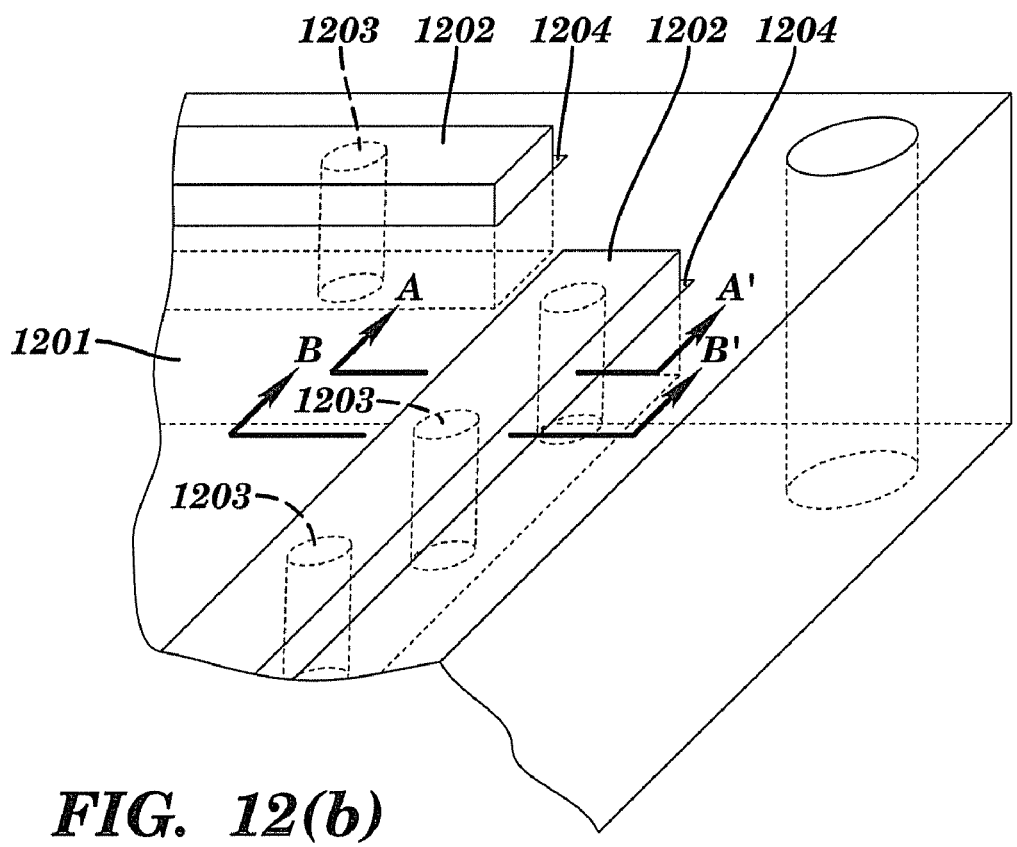

In still another exemplary embodiment, a method of stacking multi-layer green sheets features the modification of a conventional lamination tool to eliminate the pillow effect. FIG. 12 is a perspective view of a base plate 1201 (e.g., of stainless steel) having trenches formed adjacent the outer edges thereof. The trenches are each provided with a resiliently mounted load support bar 1202 disposed therein, the bars 1202 having a geometry that corresponds to the non-functional, peripheral areas of a green sheet. As shown more particularly in the detailed corner portion of FIG. 12, the support bars 1202 are biased (in an unloaded state) to sit at a heightened elevation with respect to the top surface of the base plate 1201. The individual biasing members 1203 are mounted within the trenches 1204 of the base plate 1201 and beneath the support bars 1202. The support bars may be made from the same material (e.g., stainless steel) as the base plate 1201 of the lamination tool.

Figure 13A:
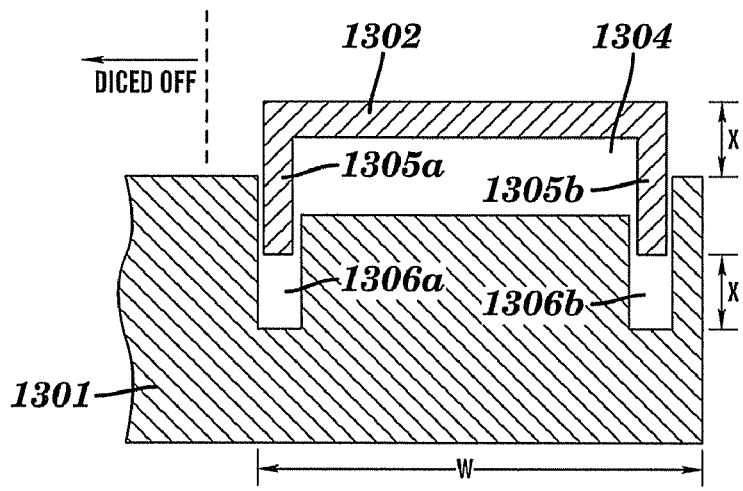
FIGS. 13(a) and 13(b) are cross-sectional views of taken along the lines A-A' and B-B' of FIG. 12, respectively.
Figure 13B:
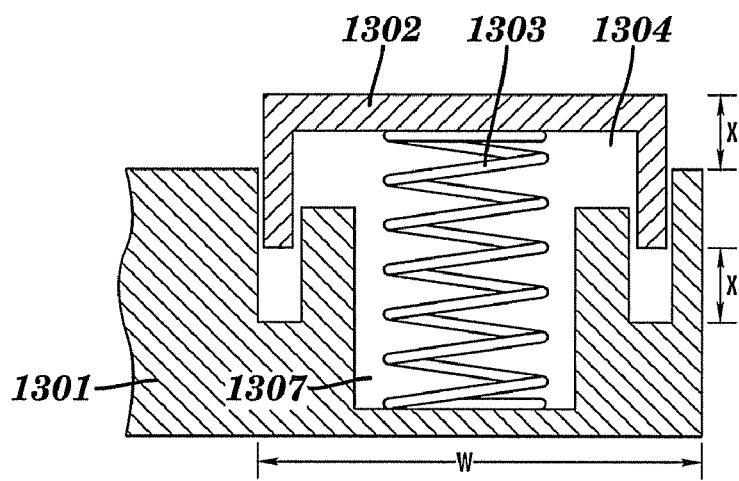

FIGS. 13(a) and 13(b) are cross-sectional views of taken along the lines A-A' and B-B' of FIG. 12, respectively. As can be seen, the distance "x" represents the height at which the support bar 1302 extends above the top surface of the base plate, and which is also equal to the height of pillow effect (as first described in FIG. 1). Again, "w" represents the width of the peripheral, non-functional areas of the green sheet. The support bar 1302 is generally C-shaped so as to have opposing sides 1305a, 1305b thereof received into corresponding grooves 1306a, 1306b of the channel 1304. As particularly shown in FIG. 13(b), each biasing member 1303 is disposed within a central groove 1307 of the channel 1304.

The mechanical properties of the biasing members 1303 are selected such that during and after the stacking of a multi-layer green laminate (but before compression), the height "x" of the resiliently mounted support bars 1302 remains substantially the same as for an unloaded tool so as to eliminate the pillow effect. Moreover, during high-pressure lamination, the support bars provide a mechanism to allow the peripheral conductor patterns on the green sheets to be laminated with uniform axial load distribution without shearing stress damage.

Figure 13C:
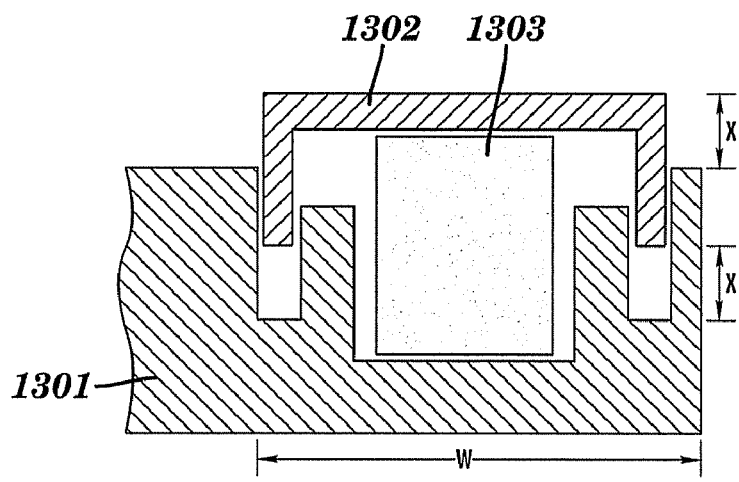
FIG. 13(c) illustrates an alternative embodiment of the biasing member shown in FIG. 13(b)

In the exemplary embodiment of FIG. 13(b), the biasing member 1303 is a compression metal spring having specifications and a spring constant (compression rate) selected and to achieve optimal performance of the support bars 1302. However, it is contemplated that other materials and components for the biasing member 1303 may also be used including, but not limited to: a silicone rubber insert (e.g., as shown in FIG. 13(c), tube like material (e.g., copper), or a bubble material, so long as the desired biasing is achieved.

Figure 14A:
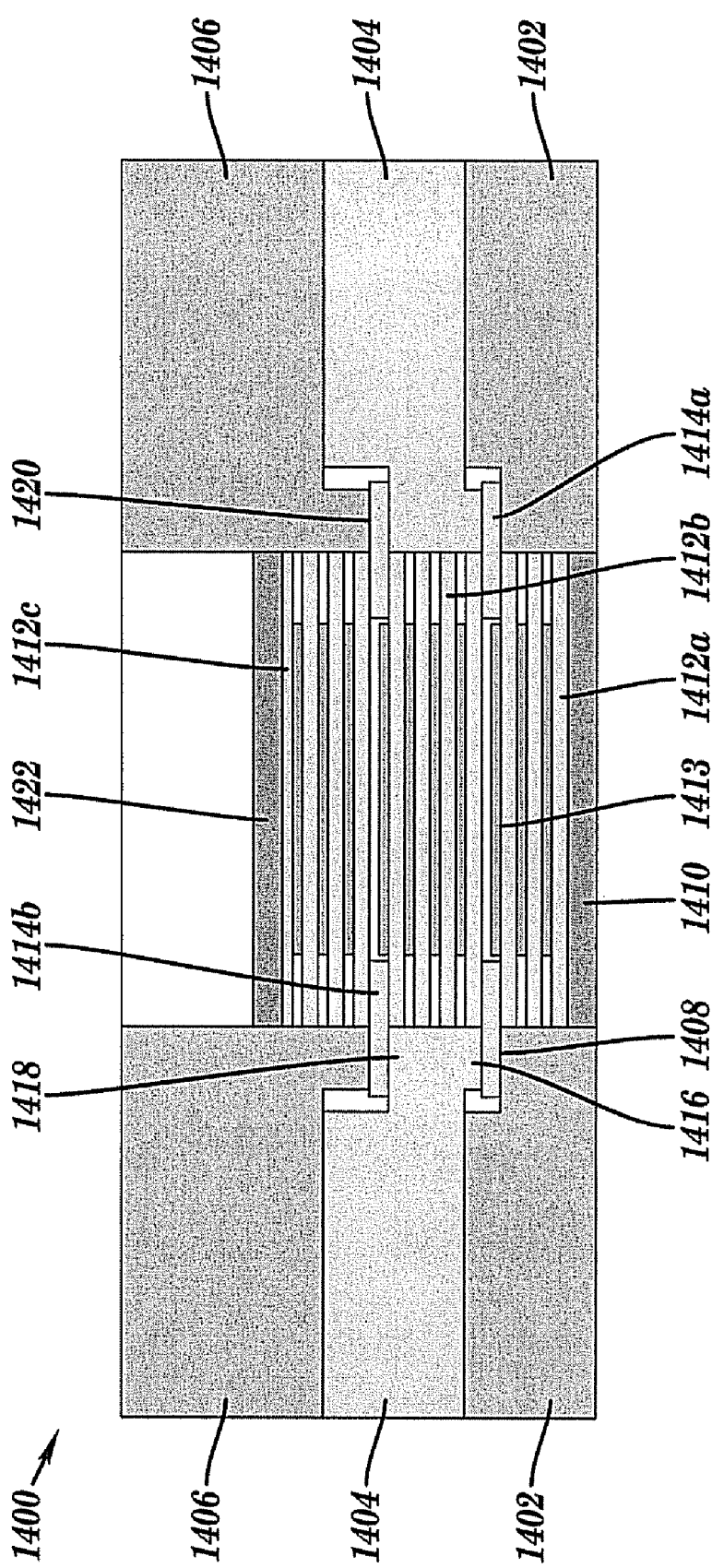
FIGS. 14(a) through 14(c) illustrate a lamination tool having a segmented frame assembly with a multiple coupon, lateral feed system, in accordance with an alternative embodiment of the invention.
Figure 14C:
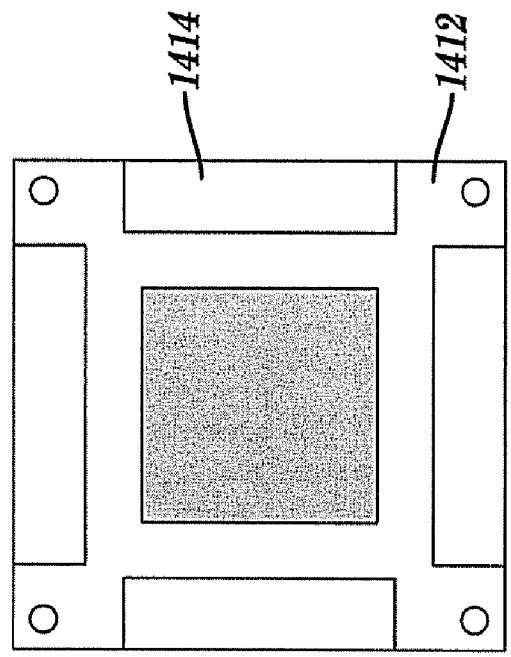
Figure 14B:
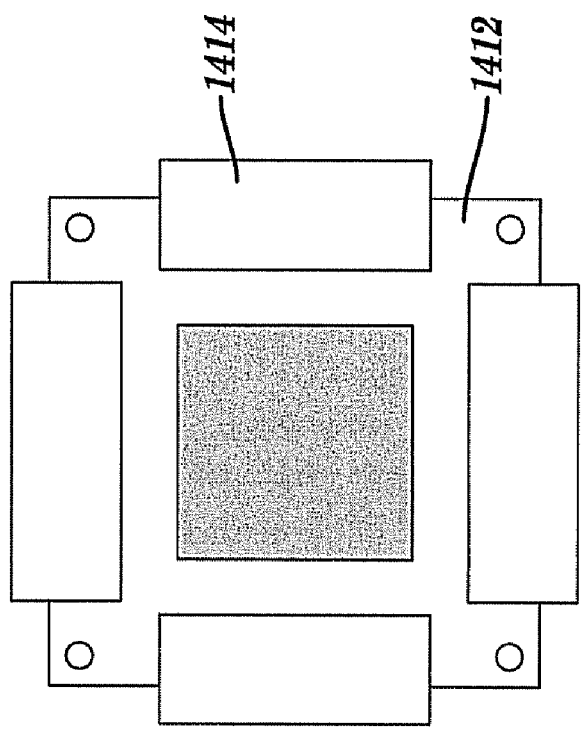

Finally, in still another exemplary embodiment, a method of stacking multi-layer green sheets features the configuration of a novel lamination tool to eliminate the pillow effect. As shown in FIGS. 14(a) through 14(c), the lamination tool 1400 is embodied as a segmented frame assembly having a multiple coupon (shim), lateral feed system. In particular, the lamination tool 1400 includes a set of bottom frame segments 1402, at least one set of one middle frame segments 1404 interlocking with the bottom frame segments 1402, and a set of top frame segments 1406 interlocking with the middle frame segments 1404. The bottom frame segments 1402 have a recessed portion that defines an upper lip 1408 thereof.

In preparation of a green sheet stack, a bottom plate 1410 is disposed at the bottom of the set of lower frame segments 1402, the bottom plate 1410 initially supporting a first plurality of green sheets 1412a having conductive paste traces 1413 formed thereon. The bottom plate 1410 may be provided with a non-stick film (e.g., polyester) thereon. When a given number of green sheets 1412a are stacked upon the bottom plate 1410 such that the stack height is roughly level with the height of the upper lip 1408, then a first plurality of coupons 1414a are laterally inserted between the bottom frame segments 1402 so as to initially rest upon both the upper lip 1408 of the bottom frame segments 1402 and the peripheral regions of the topmost green sheet at that point. A top view of the placement of the coupons 1414a is shown in FIG. 14(b).

At this point, the at least set of one middle frame segments 1404 are positioned upon the set of bottom frame segments 1402. Furthermore, the set of middle frame segments are configured to have a lower lip 1416 that contacts the top of the first plurality of coupons 1414a placed on the incomplete green sheet stack, thereby securing the position of the coupons. Thereafter, a second plurality of green sheets 1412b are then stacked upon the first plurality of coupons 1414a and green sheets 1412a, until the total height of the stack reaches an upper lip 1418 of the middle frame segments 1404. The presence of the coupons 1414a flattens the top green sheet of the first stack 1412a with respect to the bottom green sheet of the second stack 1412b, as well as prevents lateral movement therebetween.

Then, a second plurality of coupons 1414b are also laterally inserted between the middle frame segments 1404 so as to initially rest upon both the upper lip 1418 of the middle frame segments 1404 and the peripheral regions of the topmost green sheet at that point. The placement of the set of top frame segments 1406 then secures the top of the second plurality of coupons 1414b by being in contact with a lower lip 1420 of the top frame segments 1406. Finally, the laminate stack is fully defined by the addition of a third plurality of green sheets 1412c stacked above the second plurality of coupons 1414b, followed by an optional non-stick film (not shown) and a top plate 1422. It may be noted at this point that the (at least one) middle frame segments are configured with the capability for lateral movement with respect to the top and bottom frame segments in order to enable variation in coupon width.

The presence of the laterally fed coupons 1414a-c allows the top and bottom plates to translate a uniaxial force to the green sheet stacks during compression thereof. As the stack is compressed in a downward direction, the portion of the coupons 1414a-c affixed between the lip portions of the frame segments are sheared off from the remainder of the coupon portions disposed upon the peripheral areas of the green sheets, as more specifically shown in FIG. 14(c). As with the earlier embodiments, the stack is then subject to sintering, followed by removal of the kerf regions of the stack that include the sacrificial coupons.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for providing uniform axial load distribution for laminate layers of multilayer ceramic chip carriers, comprising:
    a base plate configured to support a plurality of green sheet layers on top of the base plate, the base plate having at least one resiliently mounted load support bar disposed adjacent an outer edge of the base plate;
    the at least one load support bar mounted on one or more biasing members such that the top surface of the at least one load support bar extends above the top surface of the base plate by a selected distance, and wherein the top surface of at least one load support bar supports a non-functional region of the green sheet layers directly thereupon; and
    the at least one load support bar comprising a C-shaped member disposed within at least one channel formed in the base plate, the C-shaped member comprising opposing sides received into corresponding outer grooves of the at least one channel, with each biasing member disposed within a central groove of the at least one channel, the central groove located between the outer grooves of the at least one channel.

2. The apparatus of claim 1, wherein the selected distance corresponds to a distance representing a gap created by a pillow effect stack of green sheet layers.

3. The apparatus of claim 2, wherein the biasing members are configured so as to maintain the top surface of the at least one load support bar above the top surface of the base plate at substantially the selected distance when the base plate is loaded with the plurality of green sheet layers thereon in an uncompressed state.

4. The apparatus of claim 3, wherein the base plate is configured to accommodate downward movement of the at least one load support bar, up to the selected distance, during compression of the plurality of green sheet layers.

5. The apparatus of claim 4, wherein the biasing members further comprise at least one of a spring material, a silicone rubber insert material, a bubble material and a tube material.

* * * * *